(12) United States Patent
Sattler et al.

(10) Patent No.: US 12,378,692 B2
(45) Date of Patent: Aug. 5, 2025

(54) SEMICONDUCTOR WAFER MADE OF SINGLE-CRYSTAL SILICON AND PROCESS FOR THE PRODUCTION THEREOF

(71) Applicant: SILTRONIC AG, Munich (DE)

(72) Inventors: Andreas Sattler, Trostberg (DE); Juergen Vetterhoeffer, Burghausen (DE)

(73) Assignee: SILTRONIC AG, Munich (DE)

( * ) Notice: Subject to any disclaimer, the term of this patent is extended or adjusted under 35 U.S.C. 154(b) by 155 days.

(21) Appl. No.: 18/011,949

(22) PCT Filed: May 28, 2021

(86) PCT No.: PCT/EP2021/064323
§ 371 (c)(1),
(2) Date: Dec. 21, 2022

(87) PCT Pub. No.: WO2021/259588
PCT Pub. Date: Dec. 30, 2021

(65) Prior Publication Data
US 2023/0235479 A1 Jul. 27, 2023

(30) Foreign Application Priority Data
Jun. 25, 2020 (EP) .................................... 20182286

(51) Int. Cl.
*C30B 29/06* (2006.01)
*C30B 15/20* (2006.01)
(Continued)

(52) U.S. Cl.
CPC ............ *C30B 29/06* (2013.01); *C30B 15/203* (2013.01); *C30B 15/22* (2013.01); *C30B 25/20* (2013.01);
(Continued)

(58) Field of Classification Search
None
See application file for complete search history.

(56) References Cited

U.S. PATENT DOCUMENTS

| | | | |
|---|---|---|---|
| 2002/0081440 A1* | 6/2002 | Murakami | ............. C30B 15/14 428/64.1 |
| 2006/0150894 A1 | 7/2006 | Kobayashi | |

(Continued)

FOREIGN PATENT DOCUMENTS

| | | |
|---|---|---|
| JP | 20071235343 A | 5/2007 |
| TW | 201723242 A | 7/2017 |

(Continued)

*Primary Examiner* — Jeffrey D Washville
(74) *Attorney, Agent, or Firm* — BROOKS KUSHMAN P.C.

(57) ABSTRACT

A semiconductor wafer of single-crystal silicon has an oxygen concentration per new ASTM of not less than $5.0 \times 10^{17}$ atoms/cm$^3$ and not more than $6.5 \times 10^{17}$ atoms/cm$^3$; a nitrogen concentration per new ASTM of not less than $1.0 \times 10^{13}$ atoms/cm$^3$ and not more than $1.0 \times 10^{14}$ atoms/cm$^3$;

a front side having a silicon epitaxial layer wherein the semiconductor wafer has BMDs whose mean size is not more than 10 nm determined by transmission electron microscopy and whose mean density adjacent to the epitaxial layer is not less than $1.0 \times 10^{11}$ cm$^{-3}$, determined by reactive ion etching after having subjected the wafer covered with the epitaxial layer to a heat treatment at a temperature of 780° C. for a period of 3 h and to a heat treatment at a temperature of 600° C. for a period of 10 h.

7 Claims, 5 Drawing Sheets

(51) Int. Cl.
  *C30B 15/22*   (2006.01)
  *C30B 25/20*   (2006.01)
  *C30B 33/02*   (2006.01)
  *H01L 21/02*   (2006.01)
  *H01L 21/322*  (2006.01)

(52) U.S. Cl.
  CPC ........ *C30B 33/02* (2013.01); *H01L 21/02005* (2013.01); *H01L 21/3225* (2013.01)

(56) References Cited

U.S. PATENT DOCUMENTS

| | | | |
|---|---|---|---|
| 2007/0089666 A1* | 4/2007 | Koike | C30B 15/00 |
| | | | 117/20 |
| 2009/0210166 A1* | 8/2009 | Nakamura | C30B 29/06 |
| | | | 702/23 |
| 2010/0047563 A1* | 2/2010 | Nakai | C30B 29/06 |
| | | | 257/E21.318 |
| 2018/0371639 A1* | 12/2018 | Mueller | H01L 21/02625 |
| 2020/0149184 A1* | 5/2020 | Mangelberger | C30B 30/04 |
| 2020/0165745 A1* | 5/2020 | Mueller | C30B 15/203 |

FOREIGN PATENT DOCUMENTS

| | | | | |
|---|---|---|---|---|
| WO | WO-2017108406 A1 * | 6/2017 | | C30B 15/04 |
| WO | 2019011638 A1 | 1/2019 | | |

\* cited by examiner

SEMICONDUCTOR WAFER MADE OF SINGLE-CRYSTAL SILICON AND PROCESS FOR THE PRODUCTION THEREOF

CROSS REFERENCE TO RELATED APPLICATIONS

This application is the U.S. National Phase of PCT Appln. No. PCT/EP2021/064323 filed May 28, 2021, which claims priority to European Application No. EP 20182286.3 filed Jun. 25, 2020, the disclosures of which are incorporated in their entirety by reference herein.

BACKGROUND OF THE INVENTION

1. Field of the Invention

The invention relates to a semiconductor wafer made of single-crystal silicon comprising oxygen and nitrogen, wherein a front side of the semiconductor wafer is covered with an epitaxial layer made of silicon. A semiconductor wafer having a deposited epitaxial layer is also known as an epitaxial semiconductor wafer.

2. Description of the Related Art

When the single crystal from which a semiconductor wafer originates is pulled according to the Czochralski method (CZ method) from a melt contained in a quartz crucible, the crucible material forms a source of oxygen incorporated into the single crystal and the semiconductor wafer derived therefrom. The concentration of oxygen incorporated may be controlled fairly precisely, for example by controlling the pressure and the flow of argon through the pulling apparatus or by tuning crucible and seed crystal rotation during the pulling of the single crystal or by employing a magnetic field which is applied to the melt or by a combination of these measures.

Oxygen plays an important role in the formation of BMD defects (BMDs, Bulk Micro Defects). BMDs are oxygen precipitates into which BMD seeds grow in the course of a heat treatment. They act as internal getters, i.e. as energy sinks for impurities and are therefore fundamentally advantageous. One exception is their presence at locations where the intention is to accommodate electronic components. To avoid the formation of BMDs at such locations an epitaxial layer may be deposited on the semiconductor wafer and provision made to accommodate the electronic components in the epitaxial layer.

WO 2019/011 638 A1 discloses an epitaxial silicon wafer and a method for producing it comprising a post-epi thermal treatment. The epitaxial silicon wafer comprises BMDs of octahedral shape whose mean size is 13 to 35 nm and whose mean density is not less than $3 \times 10^8$ cm$^{-3}$ and not more than $4 \times 10^9$ cm$^{-3}$, determined by IR tomography. The wafer's nickel getter efficiency is at least 90%.

Although the disclosed wafer meets current specifications of the device industry in terms of nickel getter efficiency, the post-epi heat treatment substantially increases the number of surface defects.

According to US 2006 0 150 894 A1, a semiconductor wafer covered with an epitaxial layer may be produced by depositing the epitaxial layer on a substrate wafer cut from a block of a single crystal that was subjected to a pre-anneal. Although such an epitaxial wafer shows a fairly good performance in terms of the number of surface defects, its nickel getter efficiency remains comparatively poor.

Thus, problem to be solved by the invention was to provide an epitaxial silicon wafer which shows efficient gettering of nickel as well as a comparatively low number of surface defects on the epitaxial layer.

SUMMARY OF THE INVENTION

These and other problems are solved by a semiconductor wafer made of single-crystal silicon with an oxygen concentration as per new ASTM of not less than $5.0 \times 10^{17}$ atoms/cm$^3$ and of not more than $6.5 \times 10^{17}$ atoms/cm$^3$ and a nitrogen concentration as per new ASTM of not less than $1.0 \times 10^{13}$ atoms/cm$^3$ and not more than $1.0 \times 10^{14}$ atoms/cm$^3$, wherein a front side of the semiconductor wafer is covered with an epitaxial layer made of silicon, wherein the semiconductor wafer comprises BMDs whose mean size is not more than 10 nm determined by transmission electron microscopy, and whose mean density in a region adjacent to the epitaxial layer is not less than $1.0 \times 10^{11}$ cm$^{-3}$, determined by reactive ion etching after having subjected the wafer covered with the epitaxial layer to a heat treatment at a temperature of 780° C. for a period of 3 h and to a heat treatment at a temperature of 600° C. for a period of 10 h.

DETAILED DESCRIPTION OF THE PREFERRED EMBODIMENTS

Figure 1:
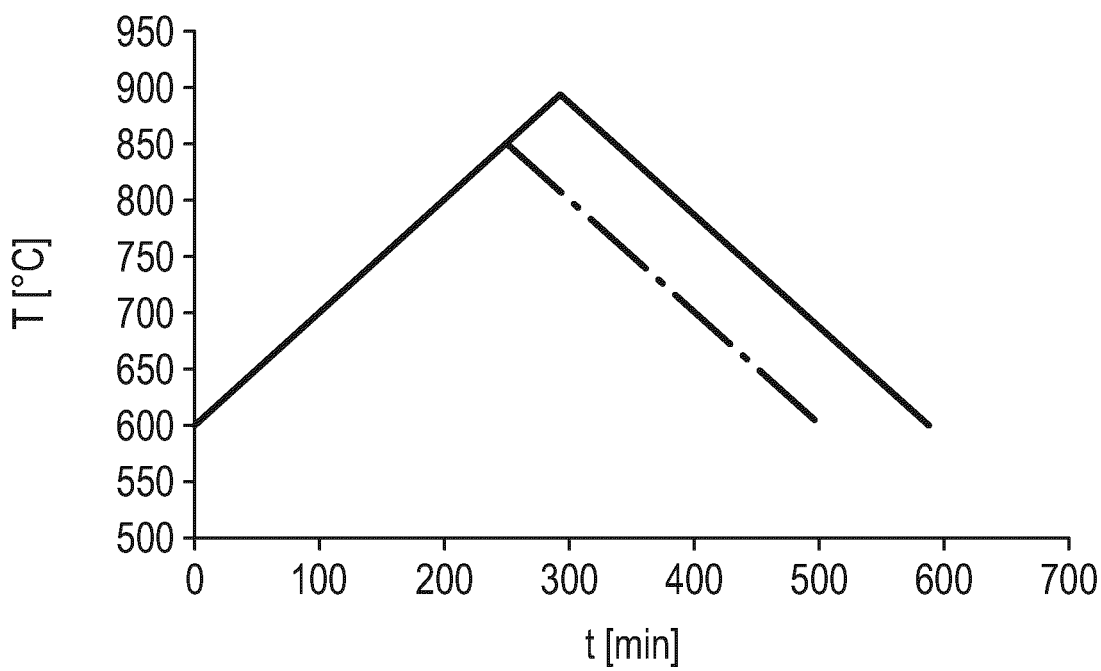
FIG. 1 shows the temperature ramps of the pre-epi heat treatments according to Examples 1 and 2.

The inventors found that the mean size of the BMDs needs to be thoroughly restricted to be not more than 10 nm in order to keep the number of surface defects at a comparatively low level. In particular, the number of surface defects which are present after the deposition of the epitaxial layer, should not be significantly increased through a pre-epitaxial heat treatment. Moreover, in order to ensure a comparatively high nickel getter efficiency, a comparatively high density of BMDs needs to be present. To achieve adequate activity as internal getters the density of BMDs must be not less than $1.0 \times 10^{11}$ cm$^{-3}$. According to an embodiment the nickel getter efficiency is at least 95%. The nickel getter efficiency is defined as by the total intentional contamination of Ni minus the amount of Ni on both wafer surface regions compared to the total intentional contamination of Ni.

According to an embodiment, the semiconductor wafer has a concentration of interstitial oxygen as per new ASTM of not less than $5.0 \times 10^{17}$ atoms/cm$^3$ and not more than $6.5 \times 10^{17}$ atoms/cm$^3$.

According to an embodiment, the semiconductor wafer has a nitrogen concentration as per new ASTM of not less than $1.0 \times 10^{13}$ atoms/cm$^3$ and not more than $1.0 \times 10^{14}$ atoms/cm$^3$. The infrared absorption of the interstitial oxygen concentration at a wave length of 1107 cm$^{-1}$ is determined by using a FTIR spectrometer. The method is performed according to SEMI MF1188. The method is calibrated with international traceable standards.

The infrared absorption of the nitrogen concentration at wave lengths of 240 cm$^{-1}$, 250 cm$^{-1}$ and 267 cm$^{-1}$ is determined by using an FTIR spectrometer. The tested material is heated to 600° C. for 6 hours prior to the measurement. The sample is cooled to 10 K during the measurement. The method is calibrated by standards with known nitrogen concentrations.

The correlation to SIMS is as follows: Nitrogen conc. FTIR (at/cm$^3$)=0.6*Nitrogen conc. SIMS (atoms/cm$^3$).

BMD size and density are determined from the center to the edge of the semiconductor wafer and evaluated by transmission electron microscopy (TEM) and reactive ion etching (RIE), respectively. The principle of RIE is disclosed, for example, in JP2007 123 543 A2.

Mean size of BMDs is defined as mean diagonal size.

Surface defects may be detected as LLS (localized light scattering defects). Detection tools operating based on optical scattering are commercially available.

According to an embodiment, the mean density of BMDs decreases in the region adjacent to the epitaxial layer in the depth direction.

According to an embodiment, dislocation loops are present in a region of the semiconductor wafer that is spaced apart from the interface between the epitaxial layer and the front side of the semiconductor wafer by not less than 2 μm and not more than 7 μm and that has a depth of at least 35 μm.

The invention is also directed to a process for producing a semiconductor wafer made of single-crystal silicon, comprising pulling a single crystal from a melt containing nitrogen according to the CZ method in an atmosphere comprising hydrogen, the partial pressure of hydrogen in the atmosphere being not less than 5 Pa and not more than 30 Pa, such that in a section of the single crystal having a uniform diameter, the oxygen concentration is not less than $5.0 \times 10^{17}$ atoms/cm$^3$ and not more than $6.5 \times 10^{17}$ atoms/cm$^3$, the nitrogen concentration is not less than $1.0 \times 10^{13}$ atoms/cm$^3$ and not more than $1.0 \times 10^{14}$ atoms/cm$^3$;

controlling a pulling velocity V such that the single crystal in the section having a uniform diameter grows in a $P_v$ region;

separating the semiconductor wafer from the section of the single crystal having a uniform diameter;

heat treating the semiconductor wafer from a temperature of not less than 600° C. to a target temperature of not more than 900° C. at a rate of not less than 0.5° C./min and not more than 2° C./min;

cooling the semiconductor wafer from the target temperature to a temperature of not more than 600° C. at a rate of not less than 0.5° C./min and not more than 2° C./min; and depositing an epitaxial layer of silicon on a front side of the heat treated semiconductor wafer to form an epitaxial semiconductor wafer.

The $P_v$ region is a region in which vacancies dominate but which is classed as defect-free because crystal originated particles (COPs) and oxidation induced stacking faults (OSFs) are not formed therein during crystallization of the single crystal. The single crystal is grown in the $P_v$ region through control of V/G, the pulling velocity V and the temperature gradient G at the interface between the single crystal and the melt.

The process according to the invention comprises heat treating the semiconductor wafer before the deposition of the epitaxial layer from 600° C. to a target temperature of not more than 900° C., preferably from 600° C. to 850° C. Preferably, the heat treating is done in an ambient of nitrogen or argon or a mixture thereof. The rate at which the semiconductor wafer is heated from 600° C. to the target temperature is not less than 0.5° C./min and not more than 2° C./min, preferably 1° C./min. The rate at which the semiconductor wafer is cooled from the target temperature to 600° C. is not less than 0.5° C./min and not more than 2° C./min, preferably 1° C./min. Preferably, the semiconductor wafer is cooled immediately after having reached the target temperature. Alternatively, the semiconductor wafer may be kept at the target temperature for a period of no longer than 180 min. In order to prevent that BMDs achieve sizes causing surface defects, the target temperature is not higher than 900° C. and the ramp rates are not less than 0.5° C./min and not more than 2° C./min.

According to an embodiment, the incorporation of oxygen in a section of the single crystal having a uniform diameter is controlled in such a way that the oxygen concentration is not less than $5.0 \times 10^{17}$ atoms/cm$^3$ and not more than $6.5 \times 10^{17}$ atoms/cm$^3$.

According to an embodiment, the incorporation of nitrogen in a section of the single crystal having a uniform diameter is controlled in such a way that the nitrogen concentration is not less than $1.0 \times 10^{13}$ atoms/cm$^3$ and not more than $1.0 \times 10^{14}$ atoms/cm$^3$. According to an embodiment, the single crystal of silicon from which the semiconductor wafer is separated is pulled in an atmosphere which comprises hydrogen, wherein the partial pressure of the hydrogen is not less than 5 Pa and not more than 30 Pa.

During pulling of the single crystal, the ratio V/G must remain within narrow limits within which the single crystal crystallizes with an appropriate excess of vacancies in the $P_v$ region. This is done by controlling the pulling velocity V to control the ratio V/G. Specifically, the pulling velocity V is chosen such that the single crystal in the section having a uniform diameter grows in the $P_v$ region.

The pulling velocity V is preferably controlled in the recited fashion in the entire section of the single crystal having a uniform diameter so that all semiconductor wafers cut from this section are grown in the $P_v$ region. The diameter of the single crystal in this section and the diameter of the resulting semiconductor wafers is preferably not less than 200 mm, more preferably not less than 300 mm.

The upper lateral surface and the lower lateral surface and also the edge of the semiconductor wafer cut from the section of the single crystal having a uniform diameter are subsequently subjected to one or more mechanical processing steps and at least one polishing step.

After having heat treated the semiconductor wafer as mentioned above, an epitaxial layer is deposited on the polished upper lateral surface (front surface) of the semiconductor wafer in a manner known per se.

The epitaxial layer is preferably composed of single-crystal silicon and preferably has a thickness of 2 μm to 7 μm.

The temperature during the deposition of the epitaxial layer is preferably 1100° C. to 1150° C.

After epitaxial deposition the semiconductor wafer does not contain any measurable concentration of hydrogen due to out-diffusion.

The semiconductor wafer and the epitaxial layer are doped with an electrically active dopant, for example boron, preferably analogously to the doping of a pp– doped epitaxial semiconductor wafer.

In a further embodiment the wafer is a nn⁻ doped epitaxial wafer.

The epitaxial semiconductor wafer develops BMDs in a region adjacent to the epitaxial layer, the mean size of the BMDs being not more than 10 nm and the density of the BMDs being not less than $1.0 \times 10^{11}$ cm$^{-3}$, provided the epitaxial wafer has been subjected to a heat treatment at a temperature of 780° C. for a period of 3 h and subsequently to a heat treatment at a temperature of 600° C. for a period of 10 h. The heat treatments simulate low thermal budget processing steps for producing electronic devices. TEM is used to determine the mean size of BMDs and RIE is used to determine the BMD density.

The inventive epitaxial semiconductor wafer is suitable for customer low thermal budget device cycles.

EXAMPLES

A 300 mm single-crystal silicon ingot was pulled at a pulling speed higher than 0.45 mm/min using a horizontal magnetic field such that the section of the ingot having a uniform diameter grew in the $P_v$ region. Nitrogen was added to the melt and the crystal was pulled in an atmosphere comprising hydrogen with a partial pressure of 10 Pa. Correct design of the hot zone ensures that the radial v/G is small enough to obtain a silicon wafer free of agglomerated vacancy defects.

The ingot nitrogen concentration measured by RT-FTIR was from $1.2 \times 10^{13}$ cm$^{-3}$ to $9 \times 10^{13}$ cm$^{-3}$. The concentration of interstitial oxygen measured by RT-FTIR was from $5.8 \times 10^{17}$ cm$^{-3}$ to $6.0 \times 10^{17}$ cm$^{-3}$.

The ingot was cut into segments, singled into 300 mm silicon wafers, ground, cleaned, double side polished and mirror polished.

Test wafers were used for heat treatment and epitaxial deposition. On each of the test wafers an epitaxial deposition step with typical epitaxial layer thickness of 2.8 μm was applied and the resulting semiconductor wafer was subjected to a final clean.

Two different types of pre-epi heat treatment were applied:

Example 1

Start at 600° C. with +1° C./min ramp up to a target temperature of 850° C. and without holding period ramp down at 1° C./min to 600° C.

Example 2

Start at 600° C. with 1° C./min ramp up to a temperature of 893° C. and without holding period ramp down at 1° C./min to 600° C.

Comparative Example

Start at 600° C. with a ramp of 10° C./min up to a temperature of 700° C., followed by a ramp of 1° C./min up to 1000° C. and without holding period a ramp down to 700° C. at a rate of 10° C./min.

The mean BMD density was determined by RIE after having subjected the epitaxial semiconductor wafers to a heat treatment at a temperature of 780° C. for a period of 3 h and to a heat treatment at a temperature of 600° C. for a period of 10 h.

The mean size of the BMDs was not more than 20 nm as determined by TEM.

FIG. 1 shows the temperature ramps of the pre-epi heat treatments according to Examples 1 and 2.

Figure 2:
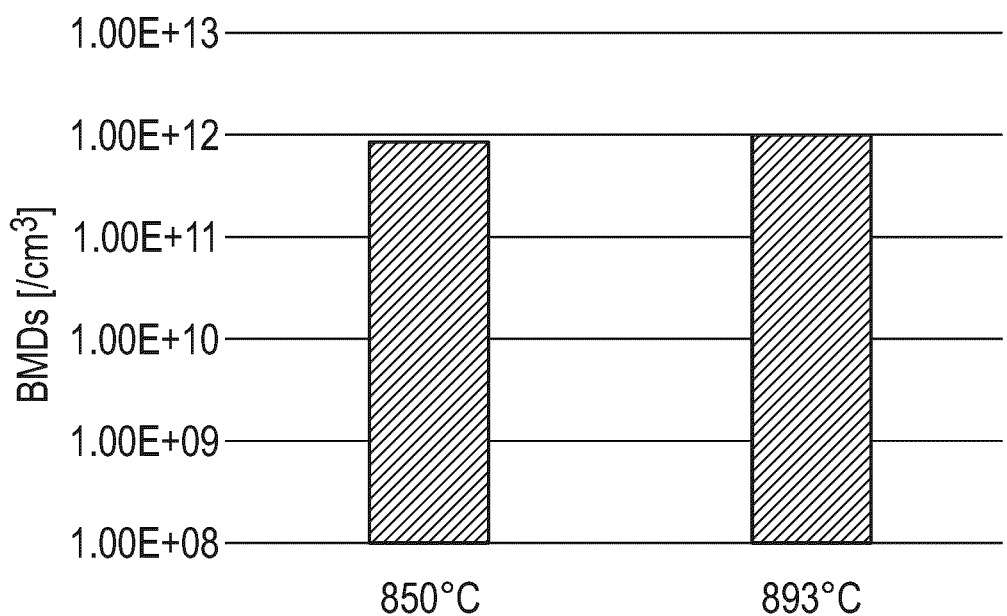
FIG. 2 shows the mean BMD density for Examples 1 and 2 as indicated by the target temperature of the heat treatment.

FIG. 2 shows the mean BMD density for Examples 1 and 2 as indicated by the target temperature of the heat treatment. The mean BMD density was determined by RIE after having subjected the epitaxial semiconductor wafers to a heat treatment at a temperature of 780° C. for a period of 3 h and to a heat treatment at a temperature of 600° C. for a period of 10 h.

The mean size of the BMDs was not more than 10 nm as measured by TEM.

Figure 3:
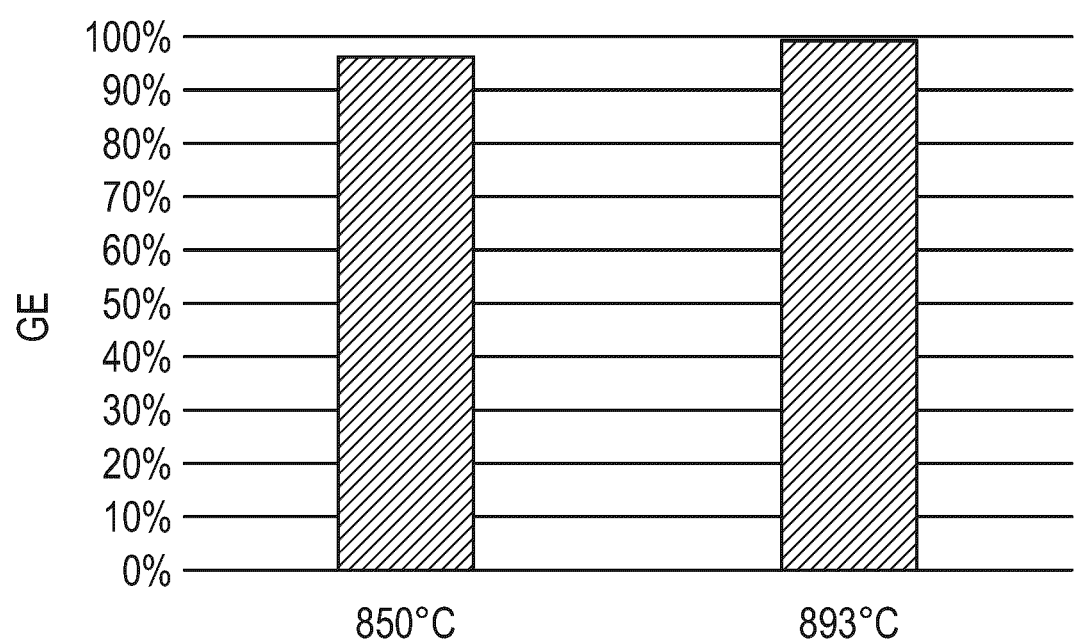
FIG. 3 shows the nickel getter efficiency (GE) for Examples 1 and 2.

FIG. 3 shows the nickel getter efficiency (GE) for Examples 1 and 2.

The getter test consists of a reproducible spin-on contamination of the wafers with nickel, followed by a metal drive-in at 600° C. for 10 h under argon with a cooling rate of 3° C./min at the end. Then the metal profile on the wafer surface and near the wafer surface is evaluated by etching step by step using a mixture of hydrofluoric and nitric acid and subsequent analysis of the respective etching solutions by inductively coupled plasma mass spectrometry (ICPMS).

Figure 4:
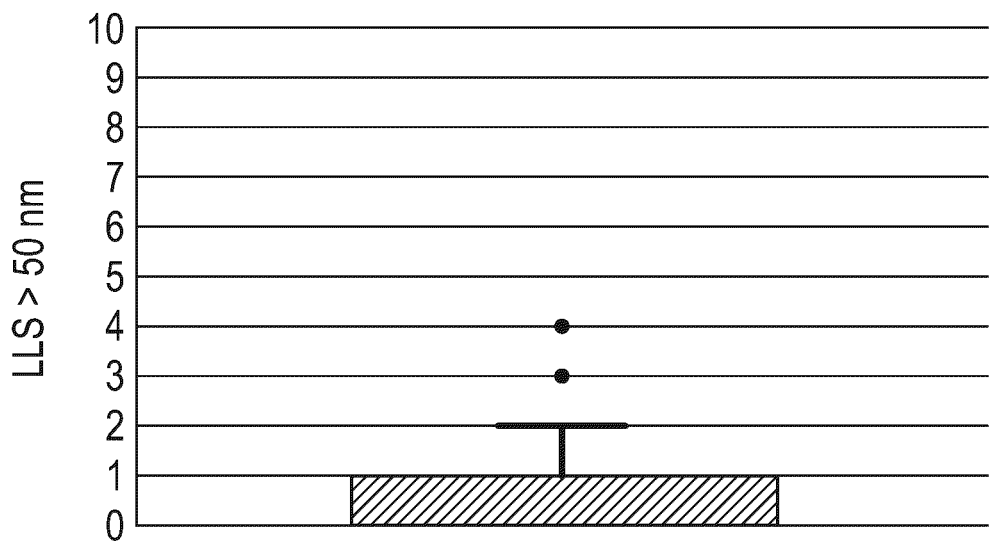
FIG. 4 presents the results of LLS measurements on 50 test epitaxial semiconductor wafers, which have been thermally treated before epitaxial deposition according to Example 1.

FIG. 4 presents the results of LLS measurements on 50 test epitaxial semiconductor wafers, which have been thermally treated before epitaxial deposition according to Example 1. The results in terms of LLS having a size of more than 50 nm are similar to the results displayed in FIG. 5.

Figure 5:
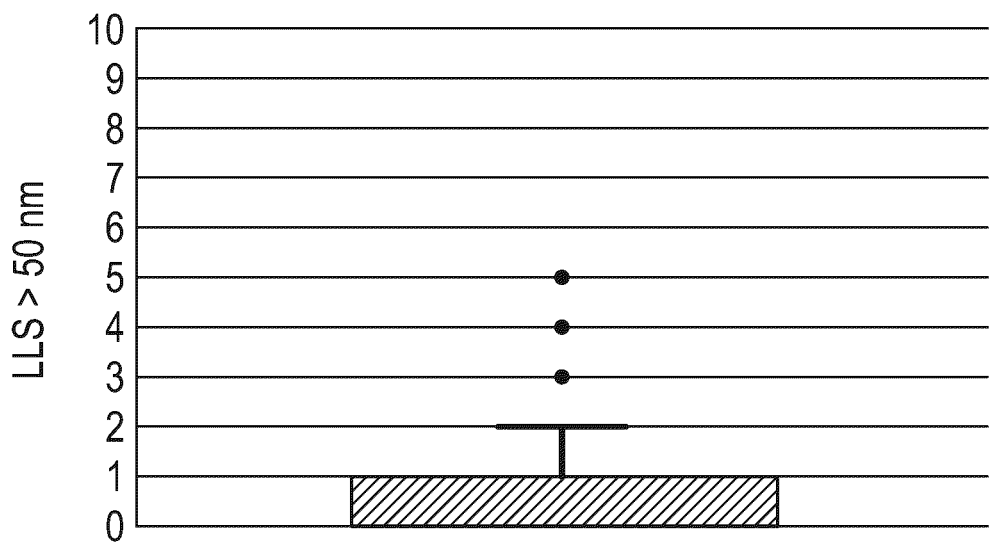
FIG. 5 presents the results of LLS measurements on 50 test epitaxial semiconductor wafers, which have not been thermally treated before epitaxial deposition.

FIG. 5 presents the results of LLS measurements on 50 test epitaxial semiconductor wafers, which have not been thermally treated before epitaxial deposition. For the LLS measurements a detection tool SP3 manufactured by KLA-Tencor Technologies Corporation was used in oblique incidence mode.

Figure 6:
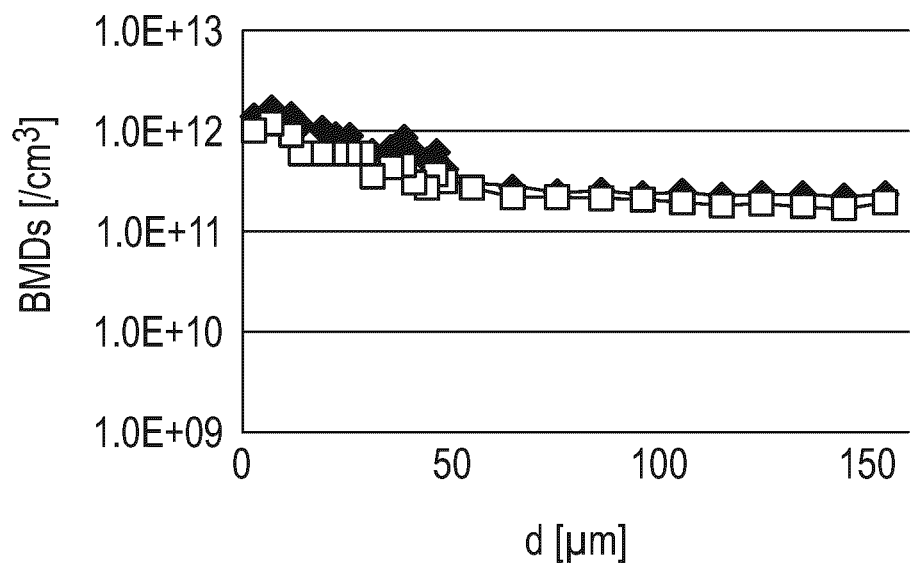
FIG. 6 shows the distribution of BMDs in depth direction to a depth d of about 150 µm (squares: Example 1, diamonds: Example 2).

FIG. 6 shows the distribution of BMDs in depth direction to a depth d of about 150 μm (squares: Example 1, diamonds: Example 2).

Figure 7:
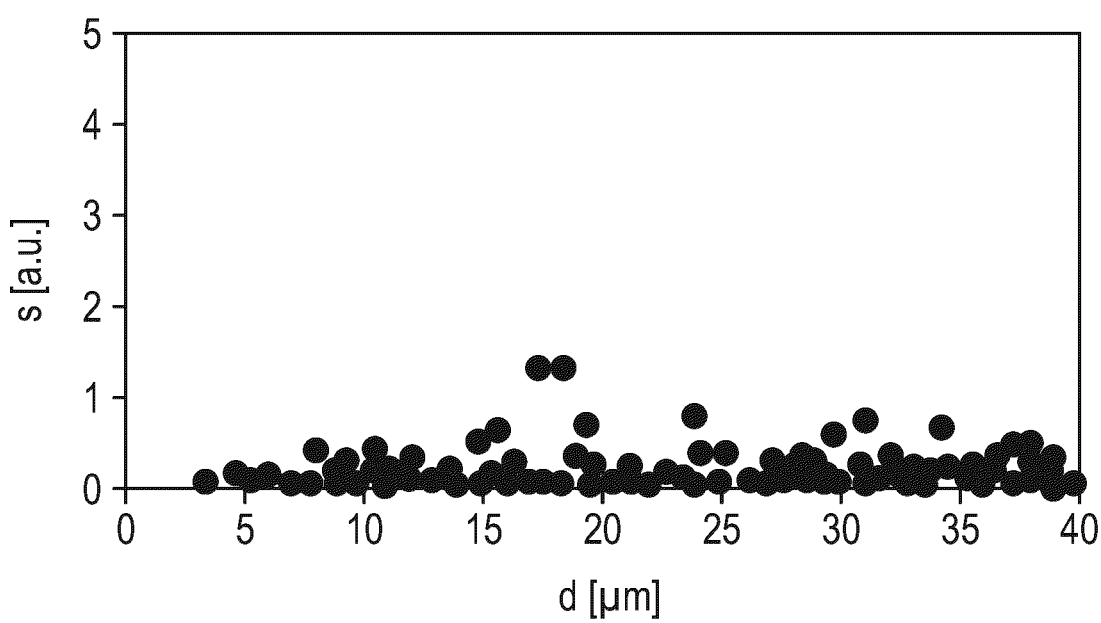
FIG. 7 shows for Example 1 the presence of dislocation loops in depth direction in terms the size (arbitrary units, a.u.) of etch pits.

FIG. 7 shows for Example 1 the presence of dislocation loops in depth direction in terms the size (arbitrary units, a.u.) of etch pits. The presence of the dislocation loops is crucial for the gettering efficiency. The presence of a dislocation loop free zone near the interface between the epitaxial layer and the semiconductor wafer is crucial to prevent defects in the epi layer.

Figure 8:
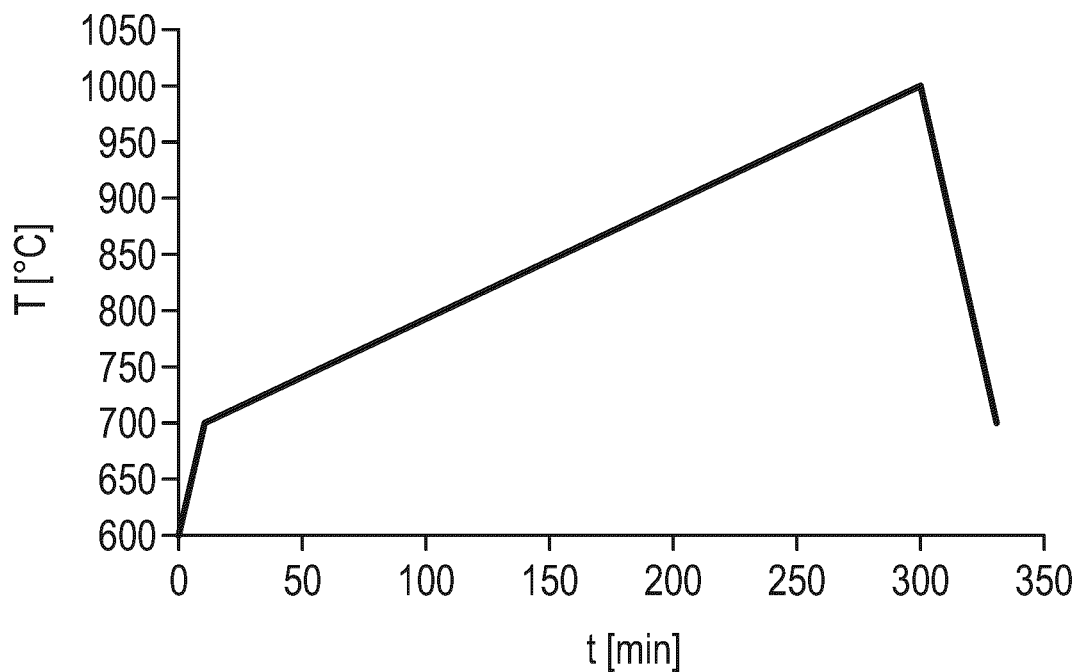
FIG. 8 shows the temperature ramps of the pre-epi heat treatment according to the Comparative Example.

FIG. 8 shows the temperature ramps of the pre-epi heat treatment according to the Comparative Example.

Figure 9:
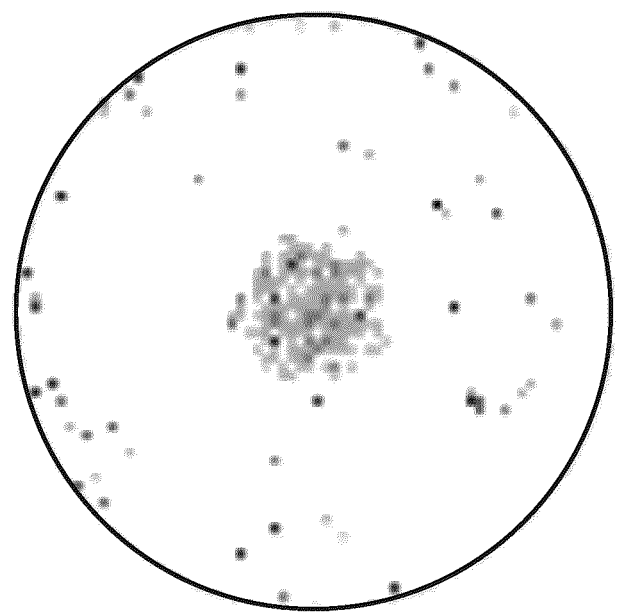
FIG. 9 represents a map displaying the positions of LLS on an epitaxial semiconductor wafer produced according to the Comparative Example.

FIG. 9 represents a map displaying the positions of LLS on an epitaxial semiconductor wafer produced according to the Comparative Example. The inventors assume that the increased number of LLS is connected to the increased mean size of BMDs.

The above description of preferred embodiments has been given by way of example only. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A single-crystal silicon semiconductor wafer having an oxygen concentration per new ASTM of not less than $5.0 \times 10^{17}$ atoms/cm$^3$ and not more than $6.5 \times 10^{17}$ atoms/cm$^3$ and a nitrogen concentration per new ASTM of not less than $1 \times 10^{13}$ atoms/cm$^3$ and not more than $1.0 \times 10^{14}$ atoms/cm$^3$, wherein a front side of the semiconductor wafer is covered with a silicon epitaxial layer, and wherein the semiconductor wafer comprises BMDs whose mean diagonal size is not more than 10 nm determined by transmission electron microscopy, and whose mean density in a region adjacent to the epitaxial layer is not less than $1.0 \times 10^{11}$ cm$^{-3}$, determined by reactive ion etching after having subjected the wafer covered with the epitaxial layer to a two stage heat treatment, a first heat treatment, at a temperature of 780° C. for a period of 3 h, followed by a second heat treatment at a temperature of 600° C. for a period of 10 h, wherein dislocation loops are present in a region of the semiconductor wafer that is spaced apart from an interface between the epitaxial layer and the front side of the semiconductor wafer by not less than 2 μm and not more than 7 μm and has a depth of at least 35 μm.

2. The wafer of claim 1, wherein the oxygen concentration is not less than $5.7 \times 10^{17}$ atoms/cm$^3$ and not more than $6.2 \times 10^{17}$ atoms/cm$^3$.

3. The wafer of claim 1, wherein the semiconductor wafer has a nickel getter efficiency of at least 95%, the nickel getter efficiency being defined as the total intentional contamination of Ni minus the amount of Ni on both wafer surface regions compared to the total intentional contamination of Ni.

4. The wafer of claim 3, wherein the mean density of BMDs decreases in the region adjacent to the epitaxial layer in a depth direction.

5. The wafer of claim 3, wherein the oxygen concentration is not less than $5.7 \times 10^{17}$ atoms/cm$^3$ and not more than $6.2 \times 10^{17}$ atoms/cm$^3$.

6. The wafer of claim 1, wherein the mean density of BMDs decreases in the region adjacent to the epitaxial layer in a depth direction.

7. The wafer of claim 6, wherein the oxygen concentration is not less than $5.7 \times 10^{17}$ atoms/cm$^3$ and not more than $6.2 \times 10^{17}$ atoms/cm$^3$.

* * * * *